(12) United States Patent
Kim

(10) Patent No.: US 8,488,407 B2
(45) Date of Patent: *Jul. 16, 2013

(54) NONVOLATILE MEMORY APPARATUS AND METHOD FOR PROCESSING CONFIGURATION INFORMATION THEREOF

(75) Inventor: Kyoung Nam Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 154 days.

This patent is subject to a terminal disclaimer.

(21) Appl. No.: 12/983,124

(22) Filed: Dec. 31, 2010

(65) Prior Publication Data

US 2012/0002486 A1    Jan. 5, 2012

(30) Foreign Application Priority Data

Jul. 2, 2010    (KR) .................. 10-2010-0063761

(51) Int. Cl.
*G11C 8/00* (2006.01)

(52) U.S. Cl.
USPC ............. 365/233.1; 365/191; 365/233.11

(58) Field of Classification Search
USPC ................... 365/233.1, 233.11, 191
See application file for complete search history.

(56) References Cited

U.S. PATENT DOCUMENTS

| | | | |
|---|---|---|---|
| 5,359,564 A | 10/1994 | Liu et al. | |
| 6,127,864 A * | 10/2000 | Mavis et al. | 327/144 |
| 6,609,185 B1 * | 8/2003 | Walton | 711/167 |
| 6,944,039 B1 | 9/2005 | Nataraj et al. | |
| 8,271,912 B2 * | 9/2012 | Ellavsky et al. | 716/101 |
| 2004/0004858 A1 | 1/2004 | Kondo | |
| 2005/0082579 A1 | 4/2005 | Horii et al. | |
| 2012/0002487 A1 * | 1/2012 | Kim et al. | 365/189.2 |

FOREIGN PATENT DOCUMENTS

| | | |
|---|---|---|
| JP | 1999-066885 | 3/1999 |
| JP | 2001-014863 | 1/2001 |
| JP | 2003-178589 | 6/2003 |
| KR | 10-2001-0070292 A | 7/2001 |
| KR | 10-2003-0047794 A | 6/2003 |

* cited by examiner

*Primary Examiner* — Kretelia Graham

(74) *Attorney, Agent, or Firm* — William Park & Associates Patent Ltd.

(57) ABSTRACT

A nonvolatile memory apparatus includes a memory device including a configuration information storage block for storing configuration data groups. A configuration information processing circuit is configured to determine majorities of configuration data groups, which are outputted from the memory device during a first period as an initial stage of a power-up operation, under the control of a first control clock signal. The configuration information processing circuit is also configured to determine majorities of configuration data groups, which are outputted from the memory device during a second period after the first period, under the control of a second control clock signal having a cycle shorter than the first control clock signal.

19 Claims, 4 Drawing Sheets

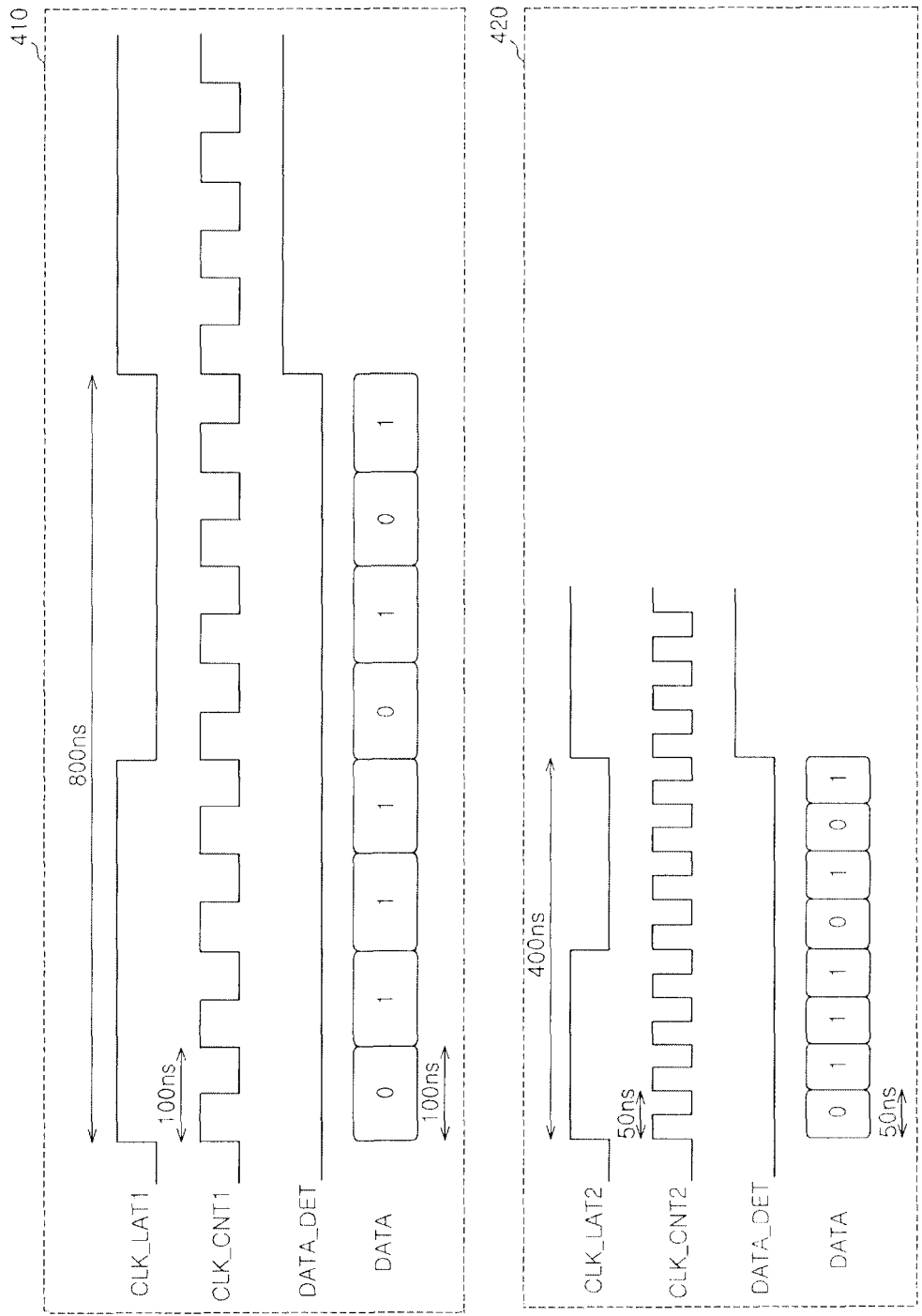

NONVOLATILE MEMORY APPARATUS AND METHOD FOR PROCESSING CONFIGURATION INFORMATION THEREOF

CROSS-REFERENCES TO RELATED APPLICATION

The present application claims priority under 35 U.S.C. §119(a) to Korean application number 10-2010-0063761, filed on Jul. 2, 2010, in the Korean Intellectual Property Office, which is incorporated herein by reference in its entirety.

BACKGROUND

1. Technical Field

The present invention relates to a nonvolatile memory apparatus, and more particularly, to a technology for processing a plurality of configuration data groups stored in a configuration information storage block.

2. Related Art

A flash memory apparatus as a kind of nonvolatile memory apparatus includes a configuration information storage block for storing a plurality of configuration data groups. The configuration information storage block is assigned to a specified block of a memory device and is composed of a plurality of nonvolatile memory cells. For reference, such a configuration information storage block is called a code address memory (CAM).

Each of the plurality of configuration data groups, which are stored in the configuration information storage block, includes any one of internal bias information, internal logic configuration information, failed address information, and redundancy information. In a power-up operation period when power is first applied to a nonvolatile memory apparatus and power initialization is performed, the plurality of configuration data groups, which are stored in the configuration information storage block, are detected and outputted by a page buffer. At this time, a process for determining majorities of the plurality of configuration data groups outputted from the page buffer is performed, and determination results are stored as a plurality of configuration signals. "Majorities" may be defined as having a majority of bits that are logical "1" in a group of bits. The group of bits may be, for example, 8 bits.

For reference, when each of the configuration data groups is programmed to the configuration information storage block, all the respective data of each configuration data group are programmed as the same value for increased reliability. For example, when assuming that one configuration data group is composed of 8-bit configuration data, eight '1's are programmed to the configuration information storage block. When the page buffer detects and outputs the configuration data group stored in the configuration information storage block, output data can be outputted with various values such as '1111 1111', '1111 1000', etc. depending upon a programmed state and detection capability. A final data value is detected by determining a majority of 8-bit data signals which are outputted. That is to say, '1' is determined as a final data value if the majority of 8-bit data signals has the value of '1.' Otherwise, '0' is determined as a final data value.

Configuration information processing is performed in this way during the power-up operation period. In this regard, in the case where the number of the plurality of configuration data groups is substantial, a lengthy time for processing configuration information is required every time power is initialized. Thus, a technology for solving this problem is demanded in the art.

SUMMARY

In one embodiment of the present invention, a nonvolatile memory apparatus includes a memory device including a configuration information storage block for storing a plurality of configuration data groups and a configuration information processing circuit configured to determine majorities of configuration data groups, which are outputted from the memory device during a first period as an initial stage of a power-up operation, under the control of a first control clock signal, and determine majorities of configuration data groups, which are outputted from the memory device during a second period after the first period, under the control of a second control clock signal having a cycle shorter than the first control clock signal.

In another embodiment of the present invention, a nonvolatile memory apparatus includes a power stabilization detection circuit configured to detect whether or not power is stabilized, a control clock output unit configured to output any one of a first control clock signal and a second control clock signal having a cycle shorter than the first control clock signal as an output clock signal according to a detection result of the power stabilization detection circuit, and a configuration data processing unit configured to determine majorities of a plurality of configuration data groups sequentially outputted from a configuration information storage block, under the control of the output clock signal, and output determination results as a plurality of configuration signals.

In still another embodiment of the present invention, a method for processing a plurality of configuration data groups during a power-up operation comprises determining majorities of configuration data groups among the plurality of configuration data groups, which are outputted during a first period as an initial stage of the power-up operation, under the control of a first control clock signal, and determining majorities of configuration data groups, which are outputted from the memory device during a second period after the first period, under the control of a second control clock signal having a cycle shorter than the first control clock signal.

BRIEF DESCRIPTION OF THE DRAWINGS

Features, aspects, and embodiments are described in conjunction with the attached drawings, in which:

FIG. 4 is a timing diagram illustrating internal operations of a data determination section shown in FIG. 3.

DETAILED DESCRIPTION

Hereinafter, various embodiments of a nonvolatile memory apparatus and a method for processing configuration information thereof according to the present invention will be described below with reference to the accompanying drawings through exemplary embodiments.

For reference, since terms, symbols and signs that are used in drawings and in this detailed description to designate devices, blocks, and so on may be used for detailed units as the occasion demands, it is to be noted that the same terms, symbols and signs may not designate the same devices, blocks, and so on in an entire circuitry. In general, the logic signals of a circuit and binary data values are divided into a high level (H) and a low level (L) in correspondence to voltage levels and may be represented as '1' and '0'. Furthermore, as the occasion demands, a high impedance state (a high-Z state) may be defined and described. Meanwhile, the data value of a data signal can be represented differently in a single bit form or a multi-bit form depending upon a voltage level or a current magnitude.

Figure 1:
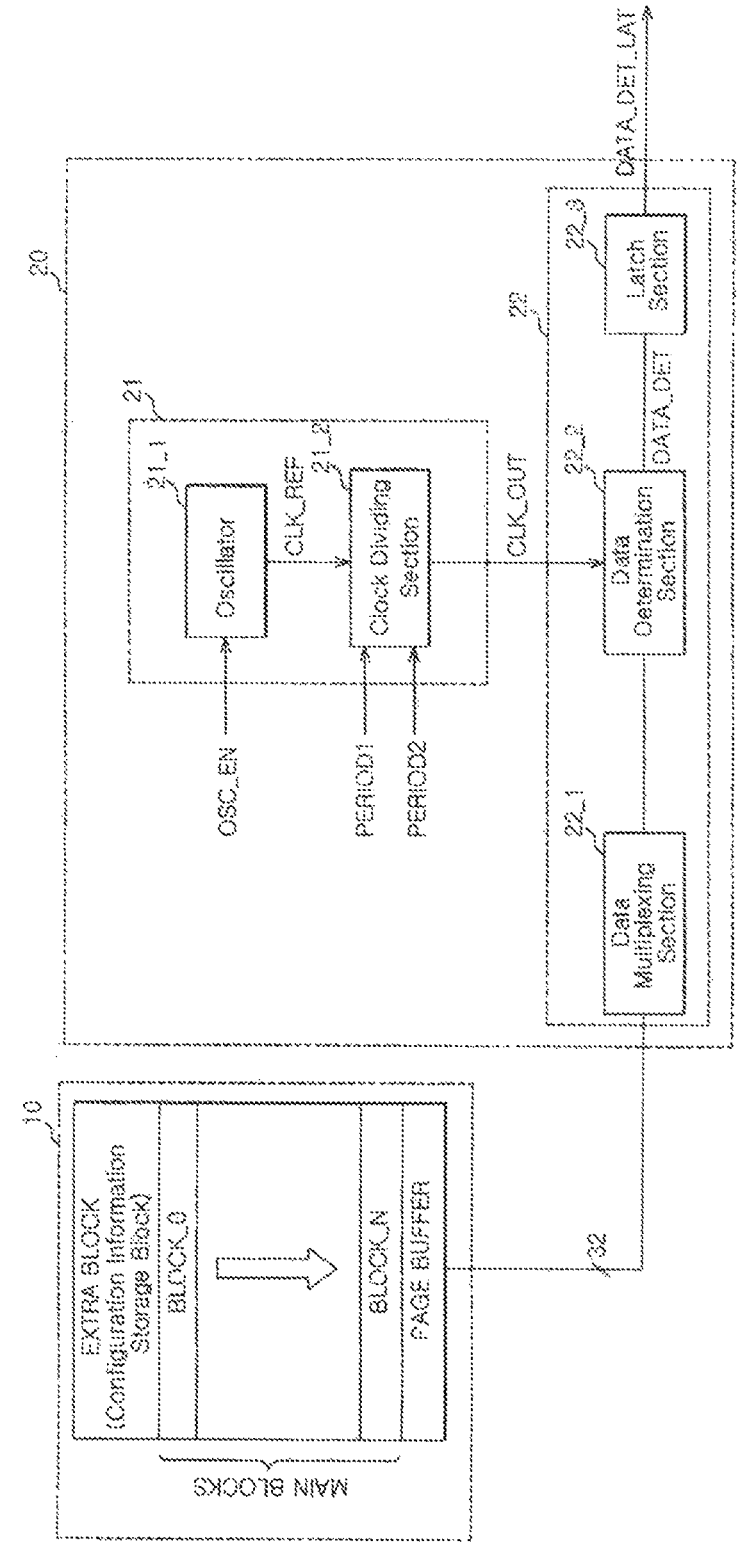
FIG. 1 is a configuration diagram of a nonvolatile memory apparatus in accordance with an embodiment of the present invention.

FIG. 1 is a configuration diagram of a nonvolatile memory apparatus in accordance with an embodiment of the present invention.

The nonvolatile memory apparatus in accordance with the embodiment of the present invention includes only a simplified configuration for the sake of clear description.

Referring to FIG. 1, a nonvolatile memory apparatus 1 includes a memory device 10 and a configuration information processing circuit 20.

The detailed configuration and principal operations of the nonvolatile memory apparatus 1 configured as mentioned above will be described below.

The memory device 10 includes main storage blocks BLOCK_0 through BLOCK_N, an extra storage block EXTRA BLOCK, and a page buffer PAGE BUFFER. Each of the main storage blocks BLOCK_0 through BLOCK_N is divided into a plurality of pages, and each page is composed of a plurality of memory cells. The extra storage block EXTRA BLOCK includes a configuration information storage block for storing a plurality of configuration data groups. The configuration information storage block is divided into a plurality of pages, and each page is composed of a plurality of memory cells. The page buffer PAGE BUFFER detects and outputs data which are stored in the configuration information storage block and the main storage blocks BLOCK_0 through BLOCK_N. For reference, each of the plurality of configuration data groups includes any one of internal bias information, internal logic configuration information, failed address information, and redundancy information.

When determining, in a power-up operation, majorities of the plurality of configuration data groups sequentially outputted from the memory device 10, the configuration information processing circuit 20 determines the majorities by discriminating two periods.

First, majorities of configuration data groups among the plurality of configuration data groups, which are outputted during a first period as an initial stage of the power-up operation, are determined under the control of a first control clock signal.

Next, majorities of configuration data groups, which are outputted during a second period after the first period, are determined under the control of a second control clock signal having a cycle shorter than the first control clock signal. "Majorities" may be defined as having a majority of bits that are logical "1" in a group of bits. The group of bits may be, for example, 8 bits.

In other words, during the first period of the initial stage of the power-up operation, since power is not stabilized, the majorities are determined using a control clock signal which has a relatively low operation frequency so as to secure operational stability. During the second period in which power is relatively stabilized, the majorities are determined using a control clock signal which has a relatively high operation frequency. Accordingly, a time required for determining majorities can be shortened while ensuring operational stability.

In the present embodiment, the configuration information processing circuit 20 includes a control clock output unit 21 and a configuration data processing unit 22.

The control dock output unit 21 outputs the first control clock signal and the second control clock signal as an output clock signal CLK_OUT in response to a first period signal PERIOD1 and a second period signal PERIOD2, respectively. In the present embodiment, the control clock output unit 21 includes an oscillator $21\_1$, and a clock dividing section $21\_2$. The oscillator $21\_1$ generates a reference clock signal CLK_REF in response to a clock enable signal OSC_EN. The clock dividing section $21\_2$ generates the first and second control clock signals by dividing the reference clock signal CLK_REF, and outputs the first control clock signal and the second control clock signal as the output clock signal CLK_OUT in response to the first period signal PERIOD1 and the second period signal PERIOD2, respectively. Namely, the clock dividing section $21\_2$ outputs the first control clock signal as the output clock signal CLK_OUT if the first period signal PERIOD1 is activated and outputs the second control clock signal having a cycle shorter than the first control clock signal as the output clock signal CLK_OUT if the second period signal PERIOD2 is activated. For reference, the first period signal PERIOD1 is a signal which is activated during the first period, and the second period signal PERIOD2 is a signal which is activated during the second period. The first and second period signals PERIOD1 and PERIOD2 can be defined as signals outputted from an internal command processing circuit, or the like.

The configuration data processing unit 22 determines majorities of the plurality of configuration data groups sequentially outputted from the memory device 10, under the control of the output clock signal CLK_OUT, and outputs determination results as a plurality of configuration signals DATA_DET_LAT. In the present embodiment, the configuration data processing unit 22 includes a data multiplexing section $22\_1$, a data determination section $22\_2$, and a latch section $22\_3$. The data multiplexing section $22\_1$ performs a function of parallel-to-serial conversion of the configuration data groups that are received from the memory device 10. The data determination section $22\_2$ determines majorities of signals outputted from the data multiplexing section $22\_1$, under the control of the output clock signal CLK_OUT, and outputs determination results. The latch section $22\_3$ latches signals outputted from the data determination section $22\_2$.

Figure 2:
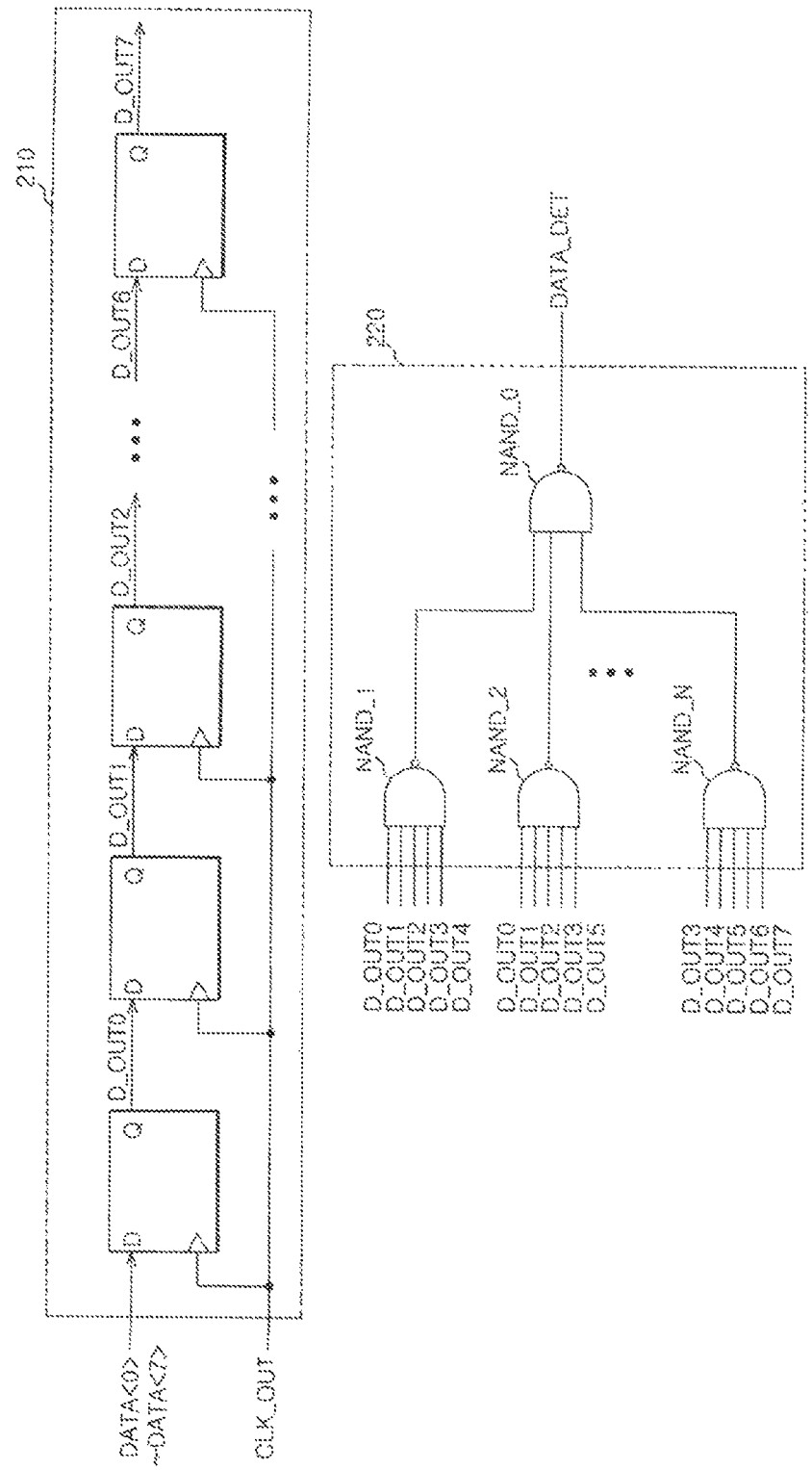
FIG. 2 is a circuit diagram illustrating an embodiment of a data determination section shown in FIG. 1.

FIG. 2 is a circuit diagram illustrating an embodiment of the data determination section $22\_2$ shown in FIG. 1.

Referring to FIG. 2, the data determination section $22\_2$ includes a plurality of D flip-flops 210, and a data combining part 220.

The plurality of D flip-flops 210 latch a plurality of data signals DATA<0> through DATA<7> which are sequentially applied, under the control of the output clock signal CLK_OUT. The data combining part 220 processes the plurality of data signals DATA<0> through DATA<7> stored in the plurality of D flip-flops, and detects a majority of high signals.

The data combining part 220 is composed of a plurality of NAND gates, NAND 1-NAND N. In the present embodiment, if 5 or more-bit data (such as a group comprising of D OUT0, D OUT1, D OUT2, D OUT3, D OUT4, a group comprising of D OUT0, D OUT1, D OUT2, D OUT3, D OUT5, or a group comprising of D OUT3, D OUT4, D OUT5, D OUT6, D OUT7, for example) among the 8-bit data are detected as '1', a final output signal DATA_DET is outputted as 1'. That is to say, the 8-bit data signals DATA<0>~DATA<7> are NANDed 5 bits at a time, and the NANDing results are NANDed again, by which a value of the final output signal DATA_DET is determined.

Figure 3:
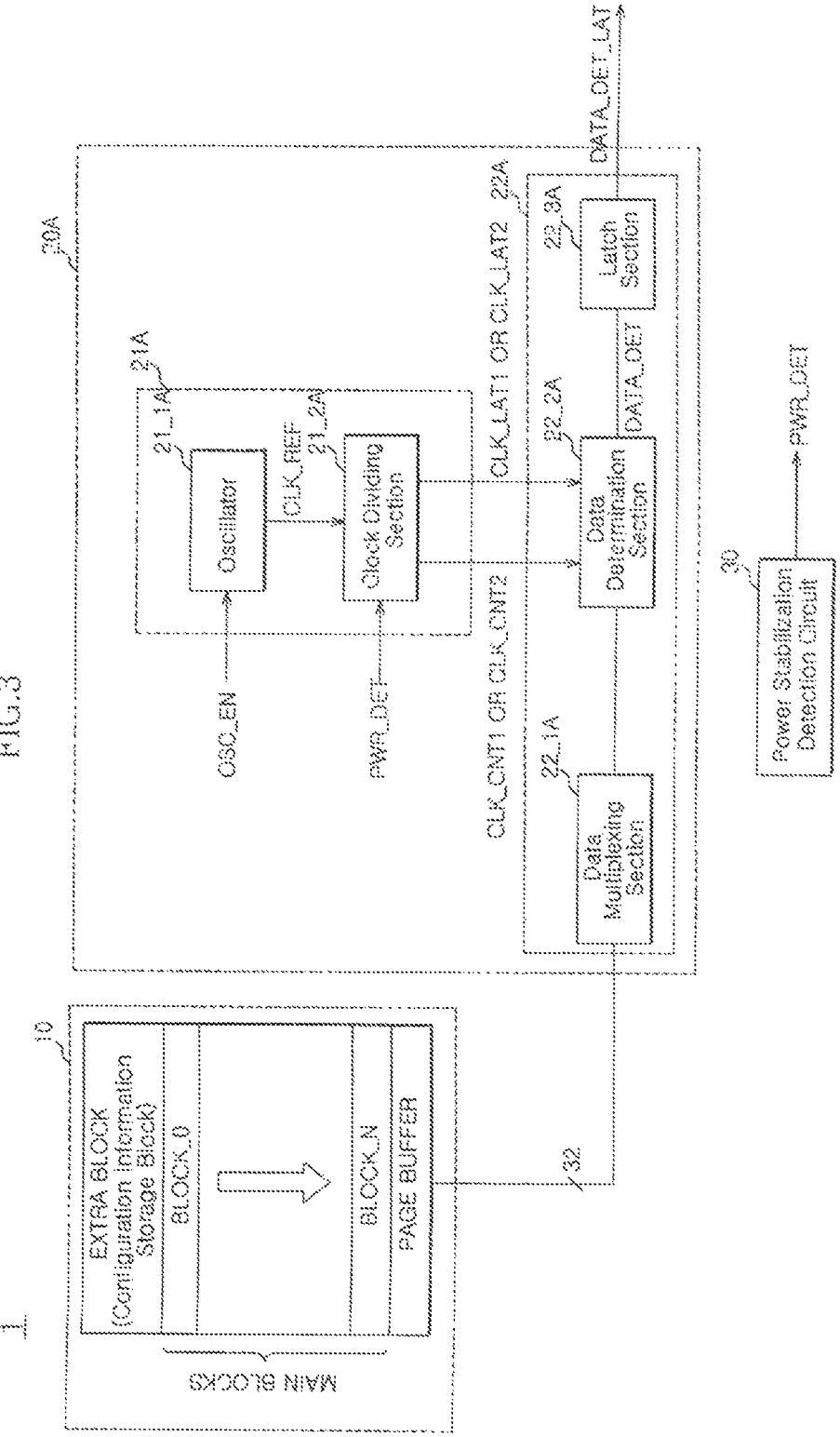
FIG. 3 is a configuration diagram of a nonvolatile memory apparatus in accordance with another embodiment of the present invention.

FIG. 3 is a configuration diagram of a nonvolatile memory apparatus in accordance with another embodiment of the present invention.

The nonvolatile memory apparatus 1 in accordance with the embodiment of the present invention includes only a simplified configuration for the sake of clear description.

Referring to FIG. 3, a nonvolatile memory apparatus 1 includes a memory device 10, a configuration information processing circuit 20A, and a power stabilization detection circuit 30. The configuration information processing circuit 20A includes a control clock output unit 21A, and a configuration data processing unit 22A.

The detailed configuration and principal operations of the nonvolatile memory apparatus 1 configured as mentioned above will be described below.

The memory device 10 includes main storage blocks BLOCK_0 through BLOCK_N, an extra storage block EXTRA BLOCK, and a page buffer PAGE BUFFER. Each of the main storage blocks BLOCK_0 through BLOCK_N is divided into a plurality of pages, and each page is composed of a plurality of memory cells. The extra storage block EXTRA BLOCK includes a configuration information storage block for storing a plurality of configuration data groups. The configuration information storage block is divided into a plurality of pages, and each page is composed of a plurality of memory cells. The page buffer PAGE BUFFER detects and outputs data which are stored in the configuration information storage block and the main storage blocks BLOCK_0 through BLOCK_N. For reference, each of the plurality of configuration data groups includes any one of internal bias information, internal logic configuration information, failed address information, and redundancy information.

The power stabilization detection circuit 30 detects whether or not power is stabilized and outputs a detection result as a power detection signal PWR_DET.

The control clock output unit 21A outputs any one of a first control clock signal and a second control clock signal having a cycle shorter than the first control clock signal as an output clock signal according to a detection result of the power stabilization detection circuit 30.

The configuration data processing unit 22A determines majorities of the plurality of configuration data groups sequentially outputted from the configuration information storage block, under the control of the output clock signal, and outputs determination results as a plurality of configuration signals DATA_DET_LAT.

In the present embodiment, the control clock output unit 21A includes an oscillator 21_1A, and a clock dividing section 21_2A. The oscillator 21_1A generates a reference clock signal CLK_REF in response to a clock enable signal OSC_EN. The clock dividing section 21_2A divides the reference clock signal CLK_REF, and thereby generates a first counting clock signal CLK_CNT1, a first latching clock signal CLK_LAT1 having a cycle longer by a predetermined number of times than the first counting clock signal CLK_CNT1, a second counting clock signal CLK_CNT2 having a cycle shorter than the first counting clock signal CLK_CNT1, and a second latching clock signal CLK_LAT2 having a cycle longer by the predetermined number of times than the second counting clock signal CLK_CNT2. The clock dividing section 21_2A outputs the first counting clock signal CLK_CNT1 and the first latching clock signal CLK_LAT1 or the second counting clock signal CLK_CNT2 and the second latching clock signal CLK_LAT2 in response to the power detection signal PWR_DET. Namely, the clock dividing section 21_2A outputs the first counting clock signal CLK_CNT1 and the first latching clock signal CLK_LAT1 as the output clock signal if the power detection signal PWR_DET maintains a low level to indicate that power is not stabilized. Also, the clock dividing section 21_2A outputs the second counting clock signal CLK_CNT2 and the second latching clock signal CLK_LAT2 as the output clock signal if the power detection signal PWR_DET maintains a high level to indicate that power is stabilized.

In the present embodiment, the configuration data processing unit 22A includes a data multiplexing section 22_1A, a data determination section 22_2A, and a latch section 22_3A. The data multiplexing section 22_1A performs a function of parallel-to-serial conversion of the configuration data groups which are applied. The data determination section 22_2A determines majorities of signals outputted from the data multiplexing section 22_1A, under the control of the output clock signal, that is, the counting clock signal and the latching clock signal outputted from the clock dividing section 21_2A, and outputs determination results. The latch section 22_3A latches signals outputted from the data determination section 22_2A. For reference, the data determination section 22_2A, which may be similar to the data determination section 22_2, can include a plurality of D flip-flops, and a data combining part. The plurality of D flip-flops are configured to latch a plurality of data signals which are sequentially applied, under the control of a corresponding counting clock signal. The data combining part is configured to process the plurality of data signals, which are stored in the plurality of D flip-flops, under the control of a corresponding latching clock signal, and detect a majority of high signals.

In the present embodiment, during a period in which power is not stabilized, the configuration information processing circuit 20A determines majorities using the first counting clock signal CLK_CNT1 and the first latching clock signal CLK_LAT1 having relatively low operation frequencies so as to secure operational stability. After power is relatively stabilized, the configuration information processing circuit 20A determines majorities using the second counting clock signal CLK_CNT2 and the second latching clock signal CLK_LAT2 having relatively high operation frequencies. Accordingly, a time required for determining majorities can be shortened while ensuring operational stability.

FIG. 4 is a timing diagram illustrating internal operations of the data determination section 22_2A shown in FIG. 3.

The internal operations of the data determination section 22_2A will be described below with reference to the timing diagram of FIG. 4.

A first timing diagram 410 represents an operation of determining a majority using the first counting clock signal CLK_CNT1 and the first latching clock signal CLK_LAT1. The second timing diagram represents an operation of determining a majority using the second counting clock signal CLK_CNT2 and the second latching clock signal CLK_LAT2.

The first counting clock signal CLK_CNT1 may have, for example, a cycle of 100 ns, and the first latching clock signal CLK_LAT1 may have, for example, a cycle of 800 ns which is eight times longer than the cycle of the first counting clock signal CLK_CNT1. Therefore, the data determination section 22_2A latches data every 100 ns cycle, determines a majority every 800 ns cycle through latched 8-bit data, and outputs a determination result as a final output signal DATA_DET.

The second counting clock signal CLK_CNT2 may have, for example, a cycle of 50 ns, and the second latching clock signal CLK_LAT2 may have, for example, a cycle of 400 ns which is eight times longer than the cycle of the second counting clock signal CLK_CNT2. Therefore, the data determination section 22_2A latches data every 50 ns cycle, determines a majority every 400 ns cycle through latched 8-bit data, and outputs a determination result as a final output signal DATA_DET.

As is apparent from the above description, the method for processing configuration information of a nonvolatile memory apparatus, suitable for processing a plurality of configuration data groups during a power-up operation, includes the steps of determining majorities of configuration data groups among the plurality of configuration data groups, which are outputted during a first period as an initial stage of the power-up operation, under the control of a first control clock signal; and determining majorities of configuration data groups among the plurality of configuration data groups, which are outputted during a second period after the first period, under the control of a second control clock signal having a cycle shorter than the first control clock signal. The method for processing configuration information of a nonvolatile memory apparatus can further include the step of detecting whether or not power is stabilized during a power-up operation period and discriminating the first period and the second period.

Therefore, the nonvolatile memory apparatus and the method for processing configuration information of a nonvolatile memory apparatus according to the embodiments of the present invention provide advantages in that a configuration information processing time can be shortened.

So far, embodiments of the present invention have been described in detail. For reference, embodiments including additional component elements, which are not directly associated with the technical spirit of the present invention, may be exemplified in order to describe the present invention in further detail. Moreover, an active high configuration or an active low configuration for indicating the activated states of signals and circuits may vary depending upon an embodiment. Since such embodiment changes have a large number of cases and can be easily inferred by those skilled in the art, the enumeration thereof will be omitted herein.

While certain embodiments have been described above, it will be understood to those skilled in the art that the embodiments described are by way of example only. Accordingly, the nonvolatile memory apparatus and the method for processing configuration information thereof described herein should not be limited based on the described embodiments. Rather, the nonvolatile memory apparatus and the method for processing configuration information thereof described herein should only be limited in light of the claims that follow when taken in conjunction with the above description and accompanying drawings.

What is claimed is:

1. A nonvolatile memory apparatus comprising:
a memory device including a configuration information storage block for storing a plurality of configuration data groups and providing the plurality of configuration data groups during a first period of a power-up operation and a second period after the first period; and
a configuration information processing circuit configured to determine majorities of configuration data groups of the plurality of configuration data groups received from the memory device during the first period of the power-up operation, under the control of a first control clock signal, and determine majorities of configuration data groups of the plurality of configuration data groups received from the memory device during the second period after the first period, under the control of a second control clock signal having a cycle shorter than the first control clock signal.

2. The nonvolatile memory apparatus according to claim 1, wherein the configuration information storage block is divided into a plurality of pages, and each page includes a plurality of nonvolatile memory cells.

3. The nonvolatile memory apparatus according to claim 1, wherein each of the plurality of configuration data groups includes any one of internal bias information, internal logic configuration information, failed address information, and redundancy information.

4. The nonvolatile memory apparatus according to claim 1, wherein the memory device comprises:
main storage blocks; and
a page buffer configured to detect and output data stored in the configuration information storage block and the main storage blocks.

5. The nonvolatile memory apparatus according to claim 4, wherein each of the main storage blocks is divided into a plurality of pages, and each page includes a plurality of nonvolatile memory cells.

6. The nonvolatile memory apparatus according to claim 1, wherein the configuration information processing circuit comprises:
a control clock output unit configured to output the first control clock signal and the second control clock signal as an output clock signal in response to a first period signal and a second period signal, respectively; and
a configuration data processing unit configured to determine majorities of the plurality of configuration data groups sequentially outputted from the memory device, under the control of the output clock signal, and output determination results as a plurality of configuration signals.

7. The nonvolatile memory apparatus according to claim 6, wherein the first period signal is a signal which is activated during the first period, and the second period signal is a signal which is activated during the second period.

8. The nonvolatile memory apparatus according to claim 6, wherein the control clock output unit comprises:
an oscillator configured to generate a reference clock signal in response to a clock enable signal; and
a clock dividing section configured to generate the first and second control clock signals by dividing the reference clock signal, and output the first control clock signal and the second control clock signal in response to the first period signal and the second period signal, respectively.

9. The nonvolatile memory apparatus according to claim 6, wherein the configuration data processing unit comprises:
a data multiplexing section configured to perform parallel-to-serial conversion of the configuration data groups to subsequently output;
a data determination section configured to determine majorities of signals of the plurality of configuration data groups outputted from the data multiplexing section, under the control of the output clock signal, and output determination results; and
a latch section configured to latch the determination results.

10. The nonvolatile memory apparatus according to claim 9, wherein the data determination section comprises:
a plurality of serially coupled D flip-flops configured to latch a plurality of data signals under the control of the output clock signal; and
a data combining part configured to determine majorities in the signals stored in the D flip-flops.

11. A nonvolatile memory apparatus comprising:
a power stabilization detection circuit configured to detect when power is stabilized;
a control clock output unit configured to output one of a first control clock signal and a second control clock signal having a cycle shorter than the first control clock signal as an output clock signal according to a detection result of the power stabilization detection circuit;
a memory device including a configuration information storage block for storing a plurality of configuration data groups and providing the plurality of configuration data groups during a first period of a power-up operation and a second period after the first period; and
a configuration data processing unit configured to determine majorities of a plurality of configuration data groups of the plurality of configuration data groups received from the memory device during the first period of the power-up operation, under the control of a first control clock signal, and determine majorities of configuration data groups of the plurality of configuration data groups received from the memory device during the second period after the first period, under the control of a second control clock signal having a cycle shorter than the first control clock signal, and output determination results as a plurality of configuration signals.

12. The nonvolatile memory apparatus according to claim 11, wherein the control clock output unit comprises:
an oscillator configured to generate a reference clock signal in response to a clock enable signal; and
a clock dividing section configured to divide the reference clock signal, generate a first counting clock signal, a first latching clock signal having a cycle longer than the first counting clock signal, a second counting clock signal having a cycle shorter than the first counting clock signal, and a second latching clock signal having a cycle longer than the second counting clock signal, and output the first counting clock signal and the first latching clock signal or the second counting clock signal and the second latching clock signal depending upon the detection result of the power stabilization detection circuit.

13. The nonvolatile memory apparatus according to claim 12, wherein the configuration data processing unit comprises
a data multiplexing section configured to perform a function of parallel-to-serial conversion of the configuration data groups to subsequently output;
a data determination section configured to determine majorities of signalss of the plurality of configuration data groups which are outputted from the data multiplexing section, under the control of a corresponding counting clock signal and a corresponding latching clock signal; and outputs the determination results; and
a latch section configured to latch the determination results.

14. The nonvolatile memory apparatus according to claim 13, wherein the data determination section comprises:
a plurality of serially coupled D flip-flops configured to latch a plurality of data signals under the control of a corresponding counting clock signal; and
a data combining part configured to determine majorities in the signals stored in the D flip-flops, under the control of a corresponding latching clock signal.

15. The nonvolatile memory apparatus according to claim 11, wherein each of the plurality of configuration data groups includes any one of internal bias information, internal logic configuration information, failed address information, and redundancy information.

16. A method for processing a plurality of configuration data groups during a power-up operation, comprising:
storing a plurality of configuration data groups from a memory device and providing the plurality of configuration data groups during a first period of the power-up operation and a second period after the first period;
determining majorities of configuration data groups of the plurality of configuration data groups outputted during the first period as an initial stage of the power-up operation, under the control of a first control clock signal; and
determining majorities of configuration data groups of the plurality of configuration data groups outputted from the memory device during the second period after the first period, under the control of a second control clock signal having a cycle shorter than the first control clock signal.

17. The method according to claim 16, further comprising: discriminating the first period as when power is not stabilized and the second period as when power is stabilized.

18. The method according to claim 16, wherein the configuration data groups are signals which are stored in a configuration information storage block.

19. The method according to claim 16, wherein each of the configuration data groups includes any one of internal bias information, internal logic configuration information, failed address information, and redundancy information.

* * * * *